(12) United States Patent
Hirata et al.

(10) Patent No.: US 6,344,974 B1
(45) Date of Patent: Feb. 5, 2002

(54) PRINTED CIRCUIT BOARD AND METHOD OF PRODUCING SAME

(75) Inventors: Minoru Hirata, Yokohama; Masakazu Hijikata, Zama, both of (JP); Hirokazu Takase, Carmel, IN (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/394,686

(22) Filed: Sep. 13, 1999

(30) Foreign Application Priority Data

Oct. 30, 1998 (JP) .............................. 10-310921

(51) Int. Cl.$^7$ ................................ H05K 7/02
(52) U.S. Cl. .................. 361/760; 361/762; 361/763; 361/764; 361/777; 361/782
(58) Field of Search ................ 361/760, 762, 361/763, 764, 766, 777, 782

(56) References Cited

U.S. PATENT DOCUMENTS 5,031,073 A * 7/1991 Chang ....................... 361/410
6,147,876 A * 11/2000 Yamaguchi et al. ........ 361/766

FOREIGN PATENT DOCUMENTS

JP 10-173299 6/1998

* cited by examiner

Primary Examiner—Jeffrey Gaffin
Assistant Examiner—Thanh Y. Tran
(74) Attorney, Agent, or Firm—Louis Woo

(57) ABSTRACT

A printed circuit board has a product board region where electronic components are mounted. The printed circuit board further has a positioning region where an element contour representing a certain mechanism element, an insulated substrate or the like is formed by a perforation line, a V-cut line or the like so as to be separated from the other portion of the positioning region along the line for another use. Instead of the foregoing element contour, a small printed circuit pattern with or without a small electronic component may be separably formed in the positioning region.

9 Claims, 3 Drawing Sheets

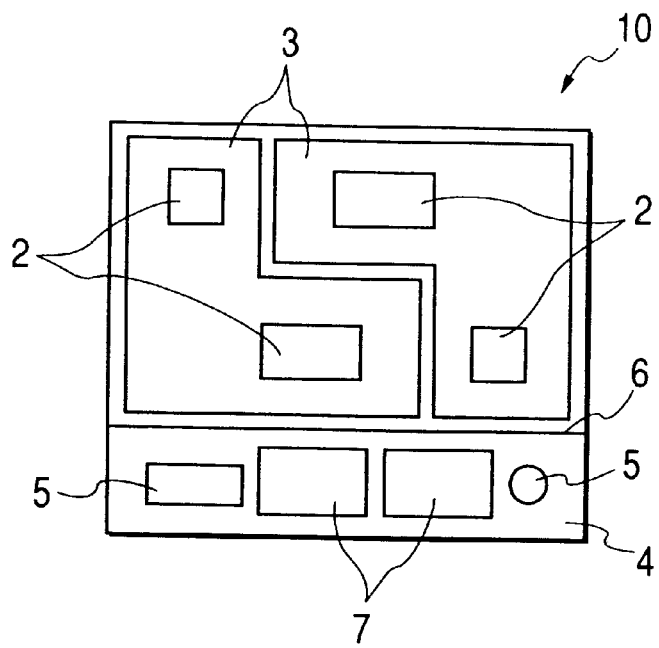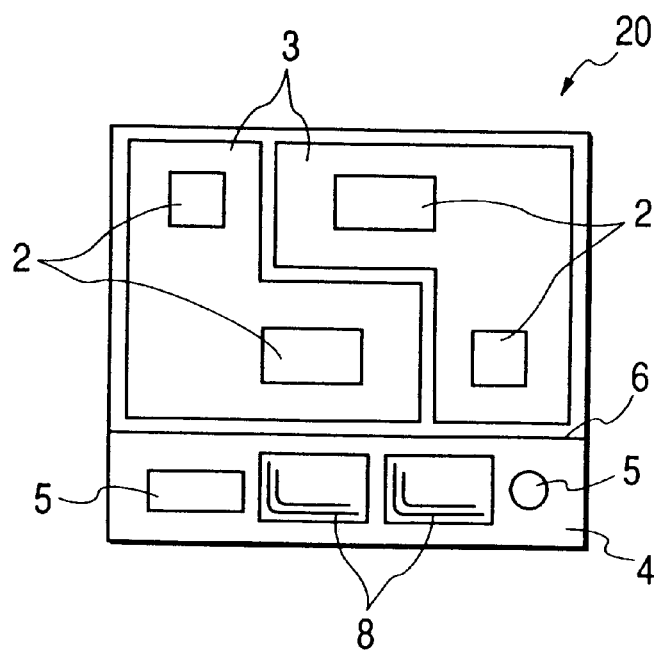

PRINTED CIRCUIT BOARD AND METHOD OF PRODUCING SAME

BACKGROUND OF THE INVENTION

1. Field of the Invention

The present invention relates to a printed circuit board having an insulated substrate formed thereon with a circuit pattern on which electronic components are mounted, and further to a method of producing such a printed circuit board.

2. Description of the Related Art

Copper foil is applied onto an insulated substrate, then a circuit pattern is formed by applying a photoresist onto the copper foil followed by exposure and development, or formed by screen printing. Then, etching is carried out to remove unnecessary portions so that a printed circuit board is produced. Subsequently, required electronic components are mounted thereon. Heretofore, an electronic component is normally attached to the board by passing a lead wire of the electronic component through a hole formed in the board and then soldering it on the underside of the board. Now, an electronic component in the form of a chip without a lead wire is in general directly connected to the circuit pattern by reflow soldering.

FIG. 5 shows a structure of a conventional printed circuit board 1 with electronic components 2 mounted thereon. Specifically, the printed circuit board 1 comprises a product board region 3 where the electronic components 2 are mounted on a circuit pattern, and a positioning region 4 which is used for positioning the product board region 3 relative to the electronic components 2 for mounting the electronic components 2 at given positions in the product board region 3. The positioning region 4 is formed with a pair of round and elongate positioning holes 5 for engagement with corresponding positioning pins provided on a carrying table of a component mounting apparatus. After the mounting of the electronic components 2 has been finished, the product board region 3 is separated from the positioning region 4 by bending the board 1 along a separation line 6 in the form of a perforation line, a V-cut line or the like.

In the structure of the foregoing conventional printed circuit board 1, however, the positioning region 4 is separated from the product board region 3 after the completion of the mounting of the electronic components 2 so as to be discarded as industrial waste. This is an adverse factor in view of the maintenance of the terrestrial environment. Also in view of the resources saving, it is required to minimize the amount of the industrial waste. Nowadays, it has been strongly demanded to the industrial world to keep as good the terrestrial environment as possible.

SUMMARY OF THE INVENTION

Therefore, it is an object of the present invention to provide a printed circuit board whose portion that has been discarded heretofore can be utilized as an element for another use.

It is another object of the present invention to provide a method of producing such a printed circuit board.

According to one aspect of the present invention, there is provided a printed circuit board having an insulated substrate formed thereon with a circuit pattern for mounting thereon an electronic component, the printed circuit board comprising a product board region for mounting the electronic component on the circuit pattern; and a positioning region provided so as to be separable from the product board region, the positioning region used for positioning the product board region relative to the electronic component, wherein a given element for another use is separably formed in an unused region of the positioning region.

It may be arranged that the given element comprises a printed circuit pattern.

It may be arranged that the given element comprises a printed circuit pattern formed thereon with an electronic component.

According to another aspect of the present invention, there is provided a method of producing a printed circuit board having an insulated substrate formed thereon with a circuit pattern, a product board region for mounting an electronic component on the circuit pattern, and a positioning region provided so as to be separable from the product board region and used for positioning the product board region relative to the electronic component, the method comprising separably forming a given element for another use in an unused region of the positioning region.

It may be arranged that the given element comprises a printed circuit pattern.

It may be arranged that the given element comprises a printed circuit pattern formed thereon with an electronic component.

BRIEF DESCRIPTION OF THE DRAWINGS

The present invention will be understood more fully from the detailed description given hereinbelow, taken in conjunction with the accompanying drawings.

In the drawings:

FIG. 1 is a plan view schematically showing a structure of a printed circuit board with electronic components mounted thereon according to a first preferred embodiment of the present invention;

FIG. 3 is a plan view schematically showing a structure of a printed circuit board with electronic components mounted thereon according to a second preferred embodiment of the present invention;

DESCRIPTION OF THE PREFERRED EMBODIMENT

Now, preferred embodiments of the present invention will be described hereinbelow with reference to the accompanying drawings.

(First Embodiment)

Figure 5:
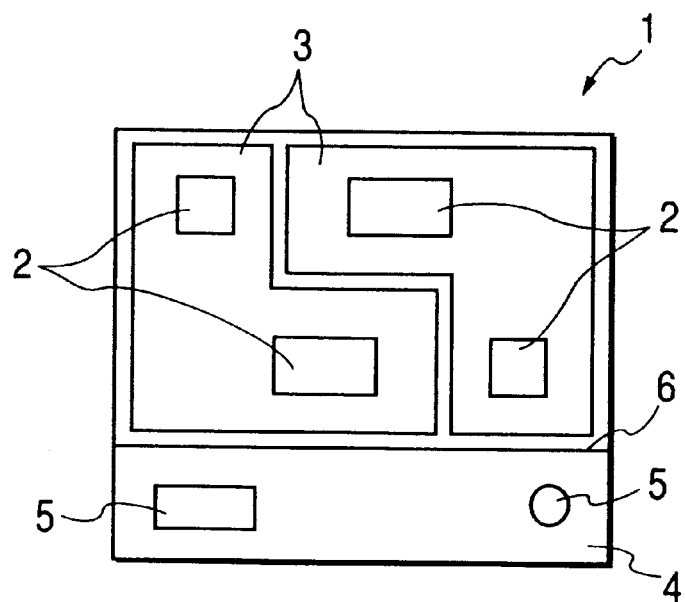
FIG. 5 is a plan view schematically showing a structure of a conventional printed circuit board with electronic components mounted thereon.

FIG. 1 shows a structure of a printed circuit board 10 with electronic components 2 mounted thereon according to the first preferred embodiment of the present invention. In FIG. 1, the same elements or portions as those shown in FIG. 5 are assigned the same reference signs.

In FIG. 1, the printed circuit board 10 comprises a product board region 3 where the electronic components 2 are mounted on a printed circuit pattern, and a positioning region 4 which is used for positioning the product board region 3 relative to the electronic components 2 for mounting the electronic components 2 at given positions in the product board region 3. The positioning region 4 is formed with a pair of round and elongate positioning holes 5 for engagement with corresponding positioning pins 15 provided on a carrying table 14 of a component mounting apparatus 11 (see FIG. 2). Further, an unused region, i.e. a region other than the positioning holes 5, of the positioning region 4 is formed with given element contours 7 (two contours in FIG. 1) each representing a certain mechanism element, a small insulated substrate or the like of given size and shape which can be used for an apparatus in which the product board region 3 with the electronic components 2 of the printed circuit board 10 is incorporated or for another apparatus. Each of the element contours 7 is defined by a perforation line, a V-cut line or the like. After the electronic components 2 have been mounted in the product board region 3, the product board region 3 and the positioning region 4 are separated from each other along a separation line 6 in the form of a perforation line, a V-cut line or the like. Then, the product board region 3 is transferred to subsequent processing, while each of the element contours 7 is separated from the other portion of the positioning region 4 so as to be utilized as an element for another use.

Figure 2:
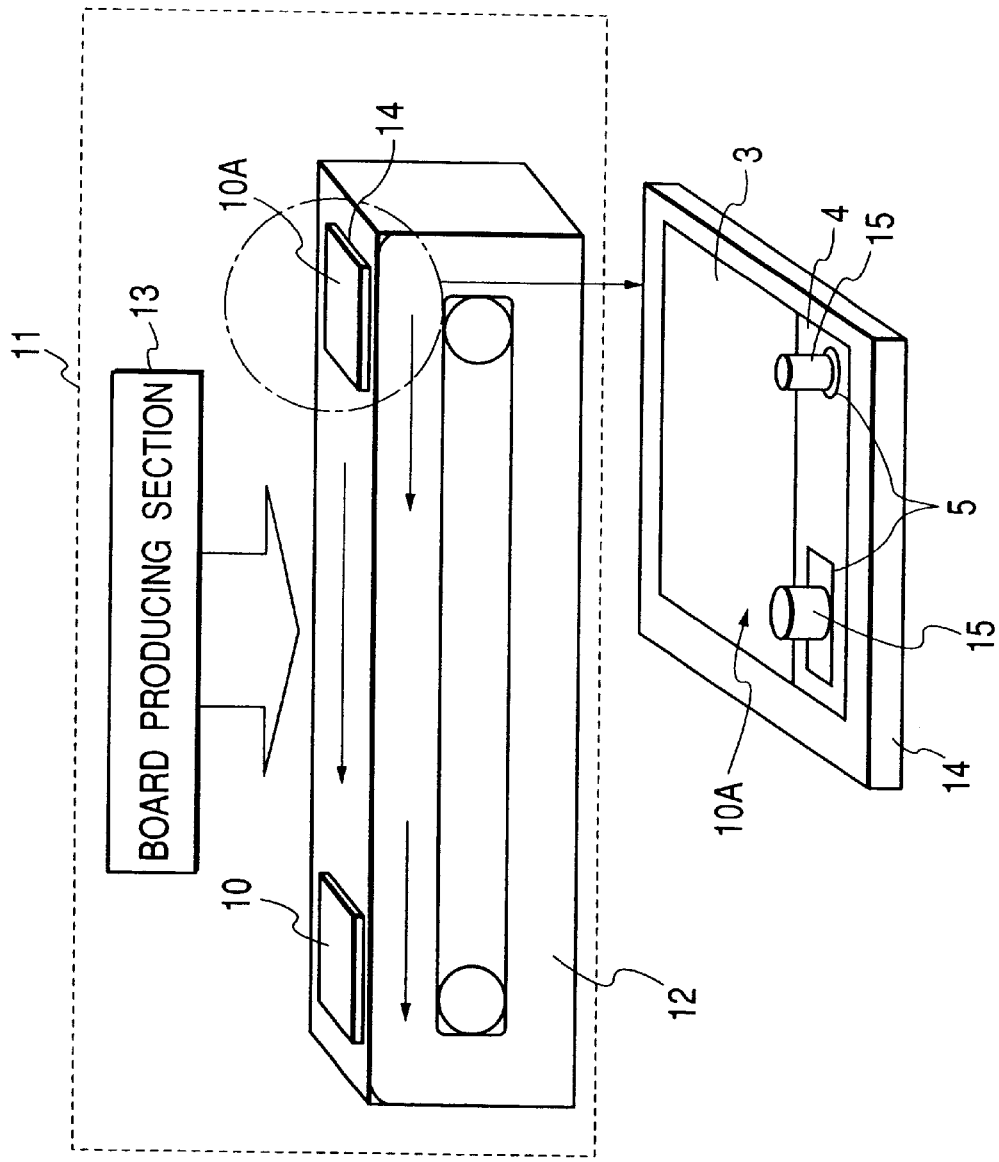
FIG. 2 is a diagram schematically showing a structure of a component mounting apparatus according to the first preferred embodiment of the present invention.

FIG. 2 shows a structure of the component mounting apparatus 11. The component mounting apparatus 11 comprises a conveyance section 12 and a board producing section 13. The conveyance section 12 is provided with the carrying table 14 for holding thereon a printed circuit board 10A (before the electronic components 2 are mounted thereon). At the start portion of the conveyance section 12, the positioning of the printed circuit board 10A is carried out through engagement between the positioning pins 15 of the carrying table 14 and the positioning holes 5 of the printed circuit board 10A. Then, while the printed circuit board 10A is transferred under the board producing section 13 on the carrying table 14, the electronic components 2 are mounted at the given positions in the product board region 3 and further the element contours 7 are formed by perforation lines, V-cut lines or the like in the positioning region 4. Subsequently, the printed circuit board 10A is taken out at the end portion of the conveyance section 12 as the finished product (printed circuit board 10).

As described above, according to the first preferred embodiment, the element contours 7 are formed in the positioning region 4 of the printed circuit board 10 so as to be used as the given elements. Thus, the reduction of the industrial waste and the effective use of the board materials can be achieved.

(Second Embodiment)

FIG. 3 shows a structure of a printed circuit board 20 with electronic components 2 mounted thereon according to the second preferred embodiment of the present invention. This embodiment differs from the foregoing first preferred embodiment in that small printed circuit patterns 8 (two patterns in FIG. 3) are formed in the positioning region 4 instead of the foregoing element contours 7. Each of the circuit patterns 8 is formed during the processing in the board producing section 13 shown in FIG. 2. Each of the circuit patterns 8 is surrounded by a perforation line, a V-cut line or the like for subsequent separation from the other portion of the positioning region 4. The perforation or V-cut line may be formed before, after or during the processing in the board producing section 13. Each of the circuit patterns 8 can be used as a small printed circuit board for an apparatus in which the product board region 3 with the electronic components 2 of the printed circuit board 20 is incorporated or for another apparatus.

(Third Embodiment)

Figure 4:
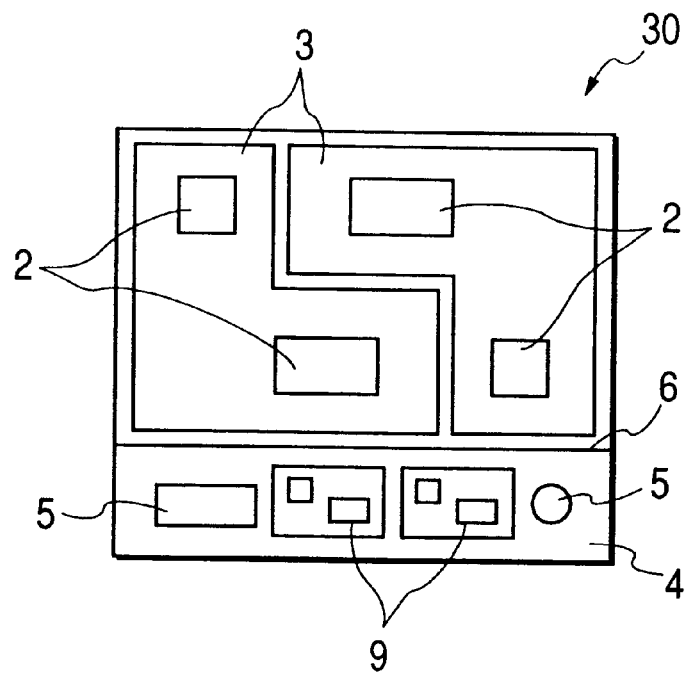
FIG. 4 is a plan view schematically showing a structure of a printed circuit board with electronic components mounted thereon according to a third preferred embodiment of the present invention.

FIG. 4 shows a structure of a printed circuit board 30 with electronic components 2 mounted thereon according to the third preferred embodiment of the present invention. This embodiment differs from the foregoing first preferred embodiment in that small printed circuit boards 9 (two printed circuit boards in FIG. 4) are formed in the positioning region 4 instead of the foregoing element contours 7. Specifically, each of the boards 9 includes a small printed circuit pattern with small electronic components mounted thereon. Each of the boards 9 is formed during the processing in the board producing section 13 shown in FIG. 2. On the other hand, the circuit pattern may be formed prior to the processing in the board producing section 13. Each of the printed circuit boards 9 is surrounded by a perforation line, a V-cut line or the like for subsequent separation from the other portion of the positioning region 4. It is preferable that the perforation or V-cut line may be formed prior to the processing in the board producing section 13. Each of the printed circuit boards 9 can be used for an apparatus in which the product board region 3 with the electronic components 2 of the printed circuit board 30 is incorporated or for another apparatus.

As described above, according to the foregoing preferred embodiments of the present invention, the mechanism elements, the insulated substrates, or the small circuit patterns with or without the small electronic components are formed in the positioning region of the printed circuit board so as to be used for their respective purposes. Thus, the reduction of the industrial waste and the effective use of the board materials can be achieved to contribute to the maintenance of the terrestrial environment as well as the resources saving, and further to the reduction in cost of the printed circuit board.

While the present invention has been described in terms of the preferred embodiments, the invention is not to be limited thereto, but can be embodied in various ways without departing from the principle of the invention as defined in the appended claims.

What is claimed is:

1. A printed circuit board having an insulated substrate formed thereon with a circuit pattern for mounting thereon an electronic component, said printed circuit board comprising:

a product board region for mounting said electronic component on said circuit pattern, a positioning region provided so as to be separable from said product board region, said positioning region used for positioning said product board region relative to said electronic component, and a separate given element for another use being separably formed in an unused region of said positioning region before said positioning and product board regions are separated.

2. The printed circuit board according to claim 1, wherein said given element comprises a printed circuit pattern.

3. The printed circuit board according to claim 1, wherein said given element comprises a printed circuit pattern formed thereon with an electronic component.

4. A method of producing a printed circuit board having an insulated substrate formed thereon with a circuit pattern, a product board region for mounting an electronic component on said circuit pattern, and a positioning region separable from said product board region used for positioning said product board region relative to said electronic component, said method comprising the steps of:

separably forming a given element for another use in an unused region of said positioning region; and separating said given element from the positioning region for said another use after completing the mounting of the electronic component in the product region.

5. The method according to claim 4, wherein said given element comprises a printed circuit pattern.

6. The method according to claim 4, wherein said given element comprises a printed circuit pattern formed thereon with an electronic component.

7. A printed circuit board having an insulated substrate formed thereon with a circuit pattern for mounting thereon an electronic component, said printed circuit board comprising:

a product board region for mounting said electronic component on said circuit pattern;

a positioning region provided so as to be separable from said product board region, said positioning region used for positioning said product board region relative to said electronic component; and a separate given element for another use being separably formed in an unused region of said positioning, said given element being separated from the positioning region for said another use after mounting of the electronic component in the product board region is completed.

8. The printed circuit board according to claim 7, wherein said given element comprises a printed circuit pattern.

9. The printed circuit board according to claim 7, wherein said given element comprises a printed circuit pattern formed thereon with an electronic component.

* * * * *